(12) United States Patent
Karg et al.

(10) Patent No.: US 8,470,676 B2
(45) Date of Patent: Jun. 25, 2013

(54) PROGRAMMABLE ELEMENT, AND MEMORY DEVICE OR LOGIC CIRCUIT

(75) Inventors: Siegfried F. Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 12/350,469

(22) Filed: Jan. 8, 2009

(65) Prior Publication Data
US 2009/0174428 A1 Jul. 9, 2009

(30) Foreign Application Priority Data

Jan. 9, 2008 (EP) ..................................... 08100282

(51) Int. Cl.
*H01L 21/8236* (2006.01)
(52) U.S. Cl.
USPC ........ 438/278; 257/4; 257/213; 257/E29.166; 257/E47.001; 326/38
(58) Field of Classification Search
USPC ............ 438/278; 257/213, E29.166, E47.001
See application file for complete search history.

(56) References Cited

U.S. PATENT DOCUMENTS

| | | | | |
|---|---|---|---|---|
| 5,623,439 A * | 4/1997 | Gotoh et al. | ................... | 365/145 |
| 6,815,744 B1 | 11/2004 | Beck | | |
| 6,946,711 B2 * | 9/2005 | Suzuki et al. | ................. | 257/376 |
| 7,088,613 B2 | 8/2006 | Lue | | |
| 2004/0160812 A1 | 8/2004 | Rinerson | | |
| 2007/0187829 A1 | 8/2007 | Lam | | |
| 2008/0001172 A1 * | 1/2008 | Karg et al. | ................... | 257/194 |

FOREIGN PATENT DOCUMENTS

WO WO-2006114904 A1 11/2006

OTHER PUBLICATIONS

Y.B. Nian, Evidence for an Oxygen Diffusion Model for the Electric Pulse Induced Resistance Change Effect in Oxides, Physical Review Letters, 98 (2007).
V. K. Yarmarkin,"Experimental Evidences of the Space Charge Activity in Pb(Ti,Zr)O3 and (Ba,Sr)TiO3 Ferroelectric Thin Film Structures", Ferroelectrics, 314, Jun. 2005.
Dr. Marcus Janousch,"Role of oxygen vacancies in Cr-doped SrTiO3 for resistance change memory", Advanced Materials, Jul. 2007.

* cited by examiner

*Primary Examiner* — Kimberly Rizkallah
*Assistant Examiner* — Timor Karimy
(74) *Attorney, Agent, or Firm* — Tutunjian & Bitetto, P.C.; Gail Zarick

(57) ABSTRACT

A multi-terminal programmable element. The programmable element includes a source electrode and a drain electrode on a base. The programmable element includes reference voltage contact that is not in contact with the source or drain electrode. The base includes a transition-metal oxide with oxygen vacancies for drifting under an applied electric field. Further, materials of the source electrode and the base are selected such that an interface of a source and/or drain electrode material and the transition metal oxide base material forms an energy barrier for electron injection from the electrode into the base material. The energy barrier has a height that depends on an oxygen vacancy concentration of the base material. Four non-volatile states are programmable into the programmable element.

11 Claims, 3 Drawing Sheets

PROGRAMMABLE ELEMENT, AND MEMORY DEVICE OR LOGIC CIRCUIT

CROSS-REFERENCE TO RELATED APPLICATIONS

This application claims priority under 35 U.S.C. §119 from European Patent Application No. 08100282.6 filed Jan. 9, 2008, the entire contents of which are incorporated herein by reference. This application is also related to the commonly owned U.S. application Ser. No. 11/961,593, entitled "PROGRAMMABLE-RESISTANCE MEMORY CELL", filed on Dec. 20, 2007, the entire contents of which are incorporated herein by reference.

BACKGROUND OF THE INVENTION

1. Field of the Invention

The invention is in the field of programmable elements and pertains to a programmable element and to a memory device containing a plurality of such programmable elements as memory elements or a logic circuit containing such programmable elements as programmable logic elements.

2. Description of the Related Art

Non-volatile memory devices in two-terminal and three-terminal geometries have been provided by the use of so-called programmable-resistance materials based on Transition Metal Oxides (TMOs). An example of such memory devices has been disclosed in U.S. Pat. No. 6,815,744. In such a memory device, electrical pulses of opposite polarity can switch the resistance reversibly and persistently between a low-resistance state and a high-resistance state. However, memory cells based on this technology have been found to exhibit a large statistical spread of the resistance values, both in one cell and from cell to cell. Also, the endurance is limited.

Another class of programmable elements is the components used in programmable logic devices or PLDs. Unlike a logic gate based on CMOS, which has a fixed function, a programmable element of a PLD has an undefined function at the time of manufacture. Before the PLD can be used in a circuit it must be programmed. A PLD element can be considered as a combination of a logic element and a memory element. As memory elements or switches, antifuse devices, EEPROMs, solid-electrolyte switches or phase-change memories are used. The PLDs, such as the FPGA (field-programmable gate arrays), have more flexibility than fixed logic gates, can be re-programmed to fix errors and have a shorter time-to-market. However, FPGAs are generally slower than their application-specific integrated circuit (ASIC) counterparts, draw more power and are less area-efficient due to the combination of logic and memory elements.

Therefore, it is desirable to provide a programmable element that is suitable of serving as non-volatile memory element with a reduced influence of statistical spread on read operations and/or with an increased endurance compared to prior art non-volatile memory cells. It is further desirable to provide a programmable element suitable as memory element with increased information density. It is even further desirable to provide a programmable element that is suitable as a logic element of a non-volatile programmable logic circuit.

SUMMARY OF THE INVENTION

According to one aspect of the present invention, a programmable element is provided including, similar to a Metal Oxide Semiconductor Field-Electric Transistor (MOSFET), a source electrode and a drain electrode on a base. The element preferably further includes a gate electrode separated from the base by a gate dielectric, the latter being an electrically insulating layer. Also, the programmable element includes a ground contact (or reference voltage contact) that in contrast to a MOSFET is not in contact with the source or drain electrode. Also, in contrast to MOSFETs, the base comprises a transition-metal oxide with mobile ions that are capable of drifting under an applied electric field. Further, materials of the source and/or drain electrodes and the base are chosen such that the following condition holds: an interface of a source and/or drain electrode material and the transition metal oxide base material forms an energy barrier for electron injection from the electrode into the base material and the energy barrier depends on a concentration of the mobile ions of the base material.

The mobile ions in of the base material serve as ionic dopants suitable of supplying or swallowing charge carriers in the transition metal oxide. A suitable and preferred class of mobile ions in the transition metal oxides is oxygen ions; so that an oxygen concentration at the interface may be altered by programming voltage pulses. In alternative embodiments, the ion concentration of the resistance switching material that can be altered can be a concentration of different ions, such as the concentration of protons or metal ions. In the following, the change of ion concentration is described to be due to the migration of oxygen vacancies.

In the above, one of the first and second oxygen vacancy concentrations may be a state with essentially no oxygen vacancies (concentration=0). By this approach, the element is programmable in a non-volatile manner, by applying voltage pulses to the source, drain and, if available, gate electrodes. The oxygen vacancies are electrically positively charged and may thus be attracted by a negative voltage pulse and repelled by a positive voltage pulse. Due to this, programming pulses may be applied to the source and drain electrodes (i.e. between the respective electrodes and the reference voltage contact) and to the gate electrode, if necessary, to define, for example, four distinct states:

(1) A high resistance (no contact) state is achieved if positive voltage pulses repelling the oxygen vacancies are applied to both the source electrode and the drain electrode, (and preferably to the gate electrode). This requires that, for electron injection into the base layer from the source electrode and the drain electron, a comparably high energy barrier has to be overcome. This means that for "read" voltages below a breakdown voltage, such injection essentially does not take place;

(2) A low resistance (contact between the source and drain electrodes) state is achieved if negative voltage pulses attracting the oxygen vacancies are applied to both the source and to the drain electrodes, (and preferably to the gate electrode). This requires that, for electron injection from both the source and the drain electrode into the base material, there is no substantial energy barrier, and between the source and drain electrodes there may be essentially a conducting path;

(3) A first rectifying state is achieved if a positive voltage pulse is applied to the source electrode and a negative voltage pulse is applied to the drain electrode (and preferably a negative voltage pulse is applied to the gate electrode). In this state, electron injection from the drain electrode into the base layer is possible, whereas for electron injection from the source electrode a high energy barrier would have to be overcome; and (4) A second rectifying state is achieved if a negative voltage pulse is applied to the source electrode and a positive voltage pulse is applied to the drain electrode (and preferably a negative voltage pulse is applied to the gate electrode). In this state, electron injection from the source electrode into the base layer is possible, whereas for electron injection from the drain electrode a high energy barrier would have to be overcome.

The approach according to the invention, in contrast to MOSFETs or similar devices, uses not only a gate electrode for programming, but to apply programming voltage pulses to the source and drain electrodes themselves. This, in combination with the non-volatility, is an entirely new approach, and it brings about important advantages.

Firstly, the four above mentioned states are clearly distinguishable. A statistical spread of resistances of the transition metal oxide material does not affect this as long as the basic (unconnected, short circuit, "forward" rectifying, "backward" rectifying) states are attained. The robustness against statistical spread of material parameters is a major advantage of a programmable element according to the invention.

Secondly, the programmable element is back-end-of-line compatible since the required elements can be added to a substrate as (laterally structured) additional material layers. Therefore, programmable elements according to the invention may be stacked on integrated circuit structures and even on top of each other.

Further, high current densities can be provided. Also, the energy efficiency compared to conventional programmable diodes is improved significantly, because the elements according to the invention are non-volatile. This is because the oxygen vacancies in the transition metal oxide are integrated in the crystal lattice and are immobile absent an electric field.

The effect of an energy barrier for electrons injected from an electrode into a transition metal oxide, where the energy barrier depends on an oxygen vacancy concentration, has been described in Jameson, et al, Applied Physics Letters 91, 112101 (2007). In an experiment described in this publication, a pair of metal electrodes on a transition metal oxide can be programmed to be rectifying. The mechanism proposed as explanation is a Schottky barrier that is eliminated at the terminal to which a negative programming voltage is applied, whereas a terminal with an applied positive voltage remains intact. In contrast to the approach according to this invention, the device tested in the named experiments allows only for two states to be programmed, and not for four of them, since programming voltages can only be applied between the two metal electrodes.

In the present invention, the presence of a gate electrode to which programming voltage pulses may be applied may help for well defining the conducting/not conducting/rectifying state of the programmable element; however, the gate electrode is not required necessarily. The device with no gate electrode brings about substantial advantages, for example, wiring is less complicated and less wiring layers will be needed compared to MOSFET devices. Also, during manufacturing there are advantages, for example, no alignment between the source/drain electrodes on the one hand and the subsequently deposited gate electrode structure on the other hand is required.

The base layer may at least partially be weakly p-doped without losing its basic insulating properties. The weak p-doping is advantageous in helping the first mentioned high resistance state be well defined in case the oxygen vacancies cannot be caused to be completely driven away. A small residual oxygen vacancy concentration remains in a vicinity near to the electrodes after application of the positive voltage pulses. The p-doping swallows the small charge carrier concentration generated by these residual oxygen vacancies.

The transition metal oxide material of the base may be a material exhibiting a so-called filling-controlled metal-insulator transition. This class of materials includes $ABO_{3-\delta}$ perovskites, A being an alkaline earth element, a rare earth element, or a combination thereof, and B being a transition-metal element. Examples are lanthanum and/or strontium titanium oxide $(La,Sr)TiO_{3-\delta}$, yttrium and/or calcium titanium oxide $(Y,Ca)TiO_{3-\delta}$, lanthanum and/or strontium manganese oxide $(La,Sr)MnO_{3-\delta}$, or praseodymium and/or calcium manganese oxide $(Pr,Ca)MnO_{3-\delta}$. Further transition metal oxides that are advantageous for the present invention include corundum such as vanadium and/or chromium oxide $(V,Cr)_2O_{3-\delta}$. Other materials that can be used advantageously include binary transition metal oxides such as nickel oxide $NiO_{1-\delta}$ or titanium oxide $TiO_{1-\delta}$. Also, preferably, the transition metal oxide material has a comparably high mobility of oxygen vacancies of $10^{-9}$ cm$^2$/Vs or higher.

According to a first embodiment, the source and drain electrodes may include a doped semiconductor, such as an n-type semiconductor. The electrodes then may include a metallic electrode contact, wherein there is an Ohmic contact between the metallic electrode contact and the n-type semiconductor.

According to a second embodiment, the source and drain electrode contacts may be metallic or a semiconductor material (such as polysilicon) having a high conductivity. For example, the source and drain electrodes may be layers added on top of the base material layer.

The invention also concerns a method of programming a programmable element of the above-mentioned kind comprising at least a source electrode and a drain electrode on a base, the base being contacted by a reference voltage contact, the base including oxygen vacancies that are capable of drifting under an applied electric field. The method includes the steps of: (1) applying positive voltage pulses to the source electrode and to the drain electrode to obtain a first programming state; (2) applying negative voltage pulses to the source electrode and to the drain electrode to obtain a second programming state; (3) applying a positive voltage pulse to the source electrode and a negative voltage pulse to the drain electrode to obtain a third programming state; and (4) applying a negative voltage pulse to the source electrode and a positive voltage pulse to the drain electrode to obtain a fourth programming state. In these, "positive" and "negative" denote the potential difference with the reference voltage contact.

If the programmable element also includes a gate electrode, the step of obtaining the first programming state preferably includes applying a positive voltage pulse to the gate electrode, and the steps of obtaining the second, third, and fourth programming states preferably include applying negative voltage pulses to the gate electrode.

If used as a memory cell, the programmable element according to the invention brings about a higher density of stored information than comparable prior art devices because four states (two data bits) can be stored on a two or three terminal element.

If used as element of a programmable logic circuit (such as a field-programmable gate array), new functionalities are enabled. Namely, four distinct, non-volatile functions can be programmed into one element, namely a high resistance (i.e. not connected), a low resistance, and two rectifier states. By this, efficient re-routing of signal paths can be implemented. Also, compared to the prior art a higher functionality per area can be achieved.

BRIEF DESCRIPTION OF THE DRAWINGS

In the following, embodiments of the invention will be described referring to accompanying drawings. The drawings are all schematic and not to scale. In the drawings, same reference numerals refer to same or corresponding elements.

DESCRIPTION OF THE PREFERRED EMBODIMENTS

Figure 1:
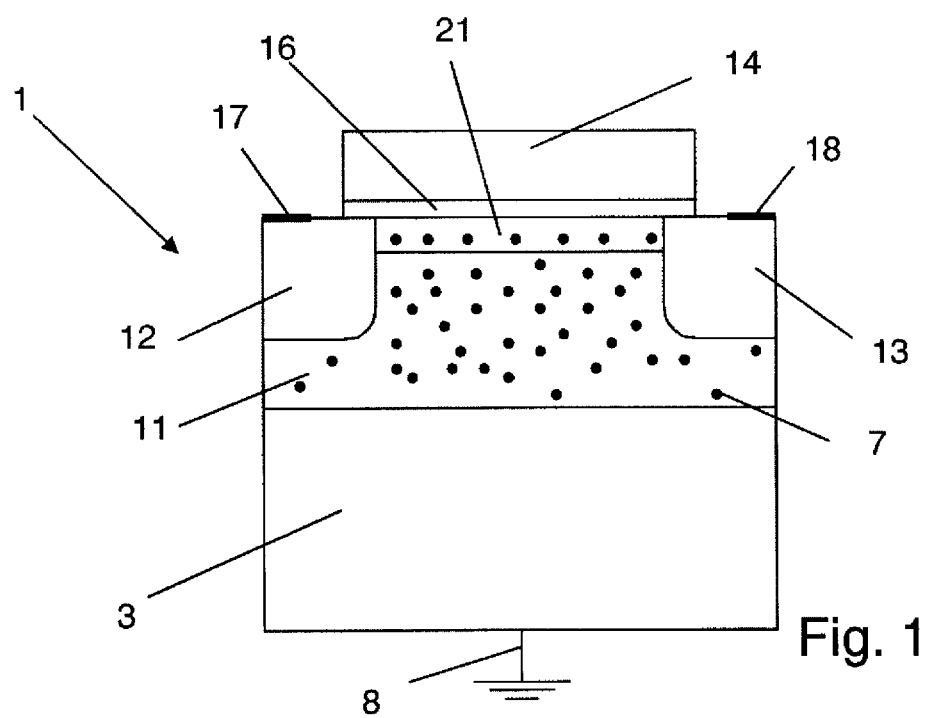
FIG. 1 shows a cross section through a first embodiment of a programmable element according to the invention.

The programmable element 1 depicted in FIG. 1 includes, on a substrate 3, a transition metal oxide base 11 that includes an optional p-doped region 21. The substrate 3 may be any know or other suitable substrate, such as a semiconducting substrate, for example silicon. The substrate 3 (and thus ultimately the base 11) is in contact with a reference voltage contact, namely a ground contact 8. The base 11 may be of a transition metal oxide or of a plurality of different transition metal oxides region. The base 11 includes transition metal oxide material with mobile oxygen vacancies 7 that are schematically represented by dots 7 in the figures. Many transition metal oxides have the property of being insulating in a basis state, however, the addition of oxygen vacancies to the crystal lattice leads to added charge carriers and as a consequence to n-type conductivity and ultimately metallic behavior. In a certain range of oxygen vacancy concentrations, therefore, the transition metal oxide behaves like an n-type semiconductor.

As an example, the transition metal oxide may be $SrTiO_3$, and it may be slightly p-doped in the p-doped region by an immobile chemical dopant such as Scandium Sc. A source electrode 12 and a drain electrode 13 are formed so as to be both in contact with the base 11. The source electrode 12 and the drain electrode 13 are both formed by negatively doped semiconductor regions. As alternatives, they could also be constituted by a metal, or (n-type) degenerate semiconductor material such as polysilicon or a doped transition metal oxide, such as $SrTiO_3$:Nb. The source electrode 12 and drain electrode 13 each include an electrode contact 17, 18 of a metallic material forming an Ohmic contact to the electrode material. In contrast to MOSFET devices, neither the source electrode 12 nor the drain electrode 13 is fixedly connected to a rear contact (the latter usually being on ground potential).

The programmable element in the illustrated embodiment further includes an optional gate electrode 14 separated from the base 11 by a gate dielectric 16. If present, the p-doped region 21 of the base is preferably adjacent the gate dielectric 14. The backside of the substrate 3 is connected to ground.

Four different states or functions can be programmed into the device due to four different spatial modulations of the oxygen vacancy profile. These different states are illustrated in FIGS. 2a-5b. In these figures, the encircled "+" and "−" symbols show the polarity of voltage pulses applied to the source, drain and gate electrodes simultaneously. In all cases, the voltages are preferably only applied as pulses, i.e. the voltages are switched off once the desired schematically illustrated oxygen vacancy concentration profile is achieved.

Figure 2A:
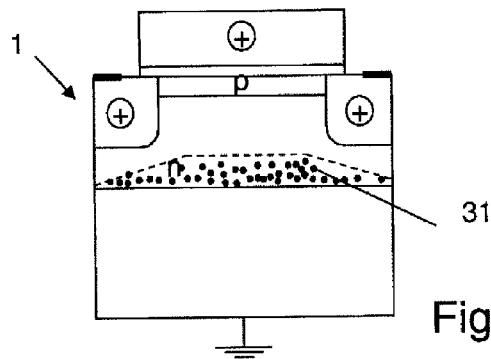
FIGS. 2a and 2b show the programmable element and a current-voltage graph, respectively, in a first switching state.
Figure 2B:
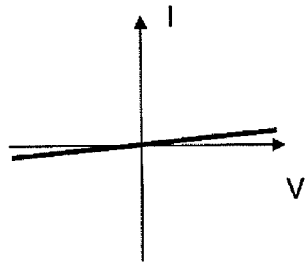

FIG. 2a shows a first state in which the programming polarity of all three electrodes is positive. The n-type region 31 formed by the oxygen vacancies is driven away from all electrodes and, for example, is formed at the interface to the substrate as illustrated in the figure. If the substrate contains oxygen with some oxygen ion mobility, the oxygen vacancies may also be driven into the substrate. In any case, the region that is n-type conducting (or ultimately metallic) is neither in contact with the source electrode nor with the drain electrode. Therefore, both injection into the base material from the source electrode and from the gain electrode is prevented by an energy barrier. In other words, it is neither possible for a current to flow from the source electrode into the base nor from the drain electrode into the base. For voltages not exceeding the breakdown voltage of the interface, the connection between the source and drain electrodes is of a high resistance type, i.e. the channel is essentially electrically insulating.

The first state may possibly also be achieved by voltage pulses only upon the source and drain electrodes (i.e. the gate electrode, even if present, may not be required for the first state).

Figure 3A:
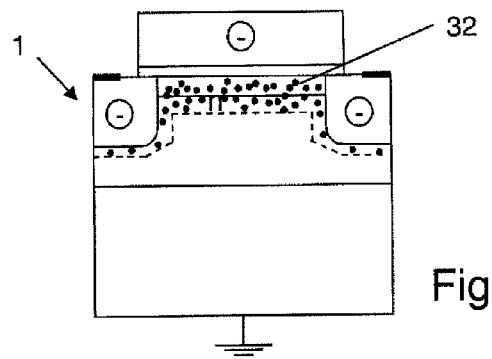
FIGS. 3a and 3b show the programmable element and a current-voltage graph, respectively, in a second switching state.
Figure 3B:
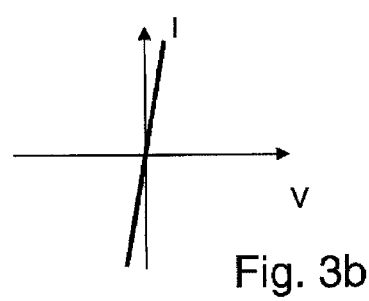

FIG. 3a shows a second state in which the programming polarity of all electrodes is negative. By this, the oxygen vacancies are attracted uniformly towards the electrodes (and, if present, towards the p-doped region 21), so that a region 32 in vicinity to the gate dielectric becomes n-type conducting. Thus, there is essentially no energy barrier for injecting a current from either electrode, a conducting path is opened between the source and drain electrodes, and the channel is essentially conducing. If a p-doped region 21 is provided, the oxygen vacancy region 32 may include the whole p-doped region 21 and more as illustrated in FIG. 3a, or it may include only a part thereof.

Figure 4A:
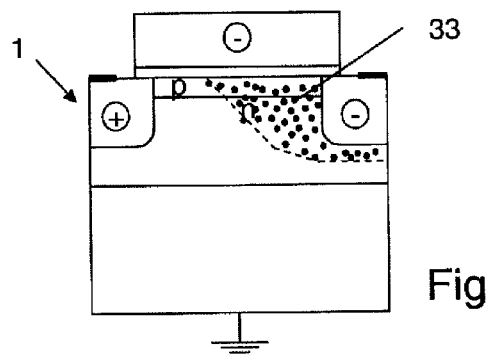
FIGS. 4a and 4b show the programmable element and a current-voltage graph, respectively, in a third switching state.
Figure 4B:
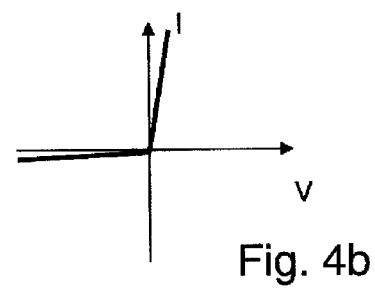

In FIG. 4a, a third state is depicted. The third state has been achieved by applying a positive voltage pulse to the source electrode, and a negative voltage pulses to the drain electrode. If a gate electrode is present, a negative voltage pulse is preferably also applied to the gate electrode. The oxygen vacancy region 33 is formed in a vicinity to the drain electrode but does not contact the source electrode. Therefore, electrons may flow from the drain electrode into the oxygen vacancy region because there is substantially no energy barrier for them. Once injected into the intrinsic and/or p-doped base, the electrons injected from the drain electrode drift in the conduction band according the mobility and the electric field. A current thus may flow from the source electrode to the drain electrode. However, a reverse current may not flow because of the energy barrier for electrons from the source electrode into the base material. The according I-V diagram is depicted in FIG. 4b.

Figure 5A:
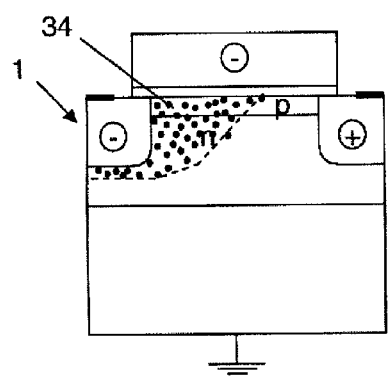
FIGS. 5a and 5b show the programmable element and a current-voltage graph, respectively, in a fourth switching state.
Figure 5B:
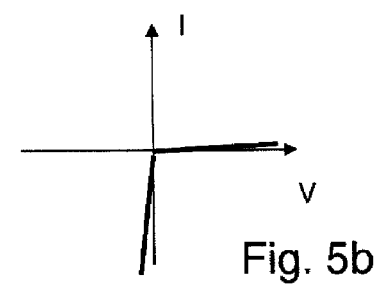

FIG. 5a shows a fourth state that has been achieved by applying a negative voltage pulse to the source electrode and to the gate electrode, and a positive voltage pulse to the drain electrode. The state corresponds to the third state with a reversed configuration (source vs. drain electrode), and all statements regarding the third state apply mutatis mutandis. The according I-V diagram is shown in FIG. 5b.

If a material combination showing such an effect is used instead of an n-type source and drain electrodes, metallic electrodes may be used.

Figure 6:
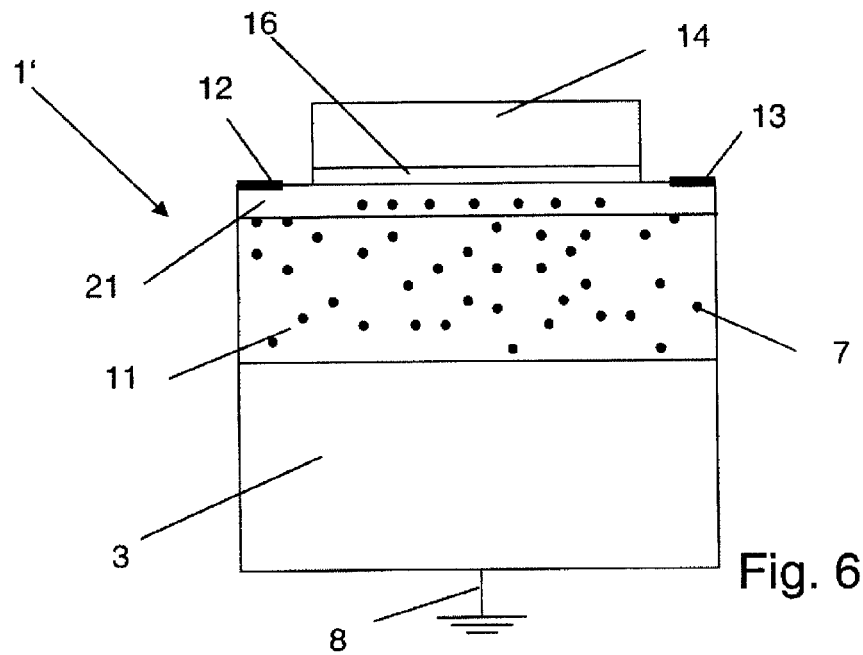
FIG. 6 shows an alternative embodiment of a programmable element according to the invention.

FIG. 6 shows a programmable element 1' where the source and drain electrodes 12, 13 are formed by metallic layers, for example, of platinum or another suitable metal. The electrodes 12, 13 are in contact with the transition metal oxide of the element. The polarities of the programming voltages and the achieved states and their I-V curves are qualitatively analogous to the configurations of FIGS. 2a-5b and are not sketched again here.

Figure 7:
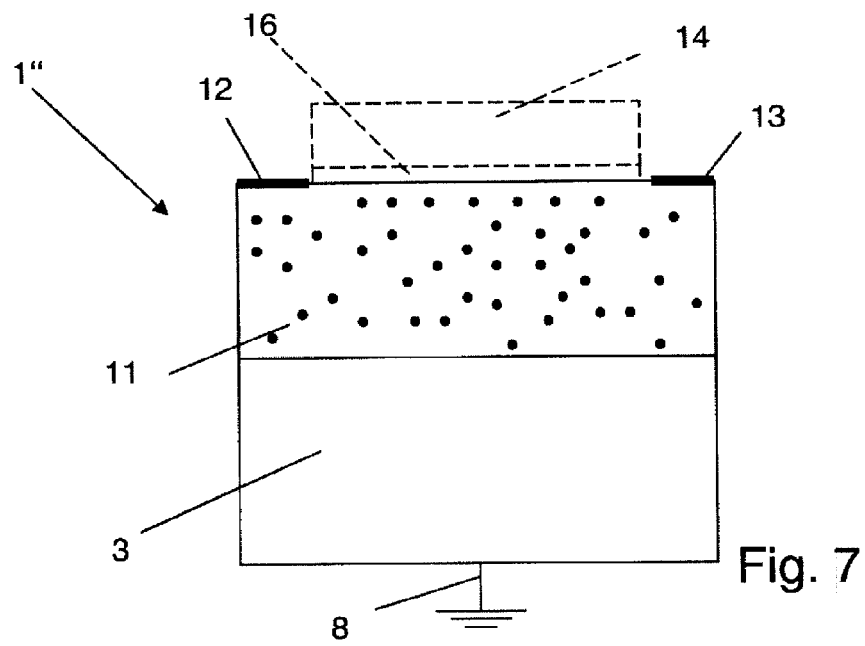
FIG. 7 shows yet another embodiment of a programmable element according to the invention.

As mentioned above, the p-doped region is optional and beneficial only if remaining oxygen vacancies in the high resistance state could be a problem. The programming voltage polarities as shown in FIGS. 2a, 3a, 4a, 5a lead to the behavior illustrated in FIGS. 2b, 3b, 4b, 5b, respectively, absent the p-doped layer. An according device is illustrated in FIG. 7. In FIG. 7, the gate electrode 14 and the gate dielectric 16 are shown by dashed lines because they are optional to emphasis the same may be done in all other illustrated embodiments. The behavior of the desired four states may be achieved also by just applying the required voltage pulses to the source and drain electrodes.

Further variants of the above-illustrated embodiments include: (1) the base 11 comprises a layered structure including more than two layers and/or layers of different transition metal oxides, (2) the substrate itself could be made of a transition metal oxide instead of silicon or similar, or (3) the device may be stacked on top of a functional element such as an integrated circuit on the silicon substrate.

While the present invention has been described in detail in conjunction with specific preferred embodiments, it is evident that many alternative, modifications and variations well be apparent to those skilled in the art in light of the foregoing description. It is therefore contemplated that the appended claims will embrace any such alternatives, modifications and variations as falling within the true scope and spirit of the present invention.

What is claimed is:

1. A method of programming a programmable element having both a source electrode and a drain electrode on a base, the base being contacted by a reference voltage contact, and the base comprising oxygen vacancies having a mobility for drifting under an applied electric field, the method comprising the steps of:
   applying positive voltage pulses to the source electrode and to the drain electrode to obtain a first programming state;
   applying negative voltage pulses to the source electrode and to the drain electrode to obtain a second programming state;
   applying a positive voltage pulse to the source electrode and a negative voltage pulse to the drain electrode to obtain a third programming state; and
   applying a negative voltage pulse to the source electrode and a positive voltage pulse to the drain electrode to obtain a fourth programming state;
   wherein the applied voltage pulses are relative to a reference voltage of the reference voltage contact.

2. The method according to claim 1, wherein the programmable element comprises a gate electrode separated from a surface of the base by a gate dielectric, wherein the step of obtaining a first programming state includes applying a positive voltage to the gate electrode, and wherein the steps of obtaining the second, third and fourth programming states include applying a negative voltage to the gate electrode.

3. The method according to claim 2, wherein only the gate electrode is grounded.

4. The method according to claim 1, wherein the base comprises a transition-metal oxide.

5. The method according to claim 4, wherein the transition-metal oxide includes $NiO_{1-\delta}$, $TiO_{1-\delta}$, $VO_{3-\delta}$, $CrO_{3-\delta}$, or $(V, Cr)O_{3-\delta}$, wherein $\delta$ is a positive quantity less than the integer it follows.

6. The method according to claim 4, wherein the mobility of oxygen vacancies of the transition-metal oxide is at least $10^{-9}$ cm$^2$/Vs.

7. The method according to claim 4, wherein the transition-metal oxide exhibits a filling-controlled metal-insulator transition.

8. The method according to claim 7, wherein the transition-metal oxide comprises $ABO_{3-\delta}$ perovskites wherein A is selected from the group consisting of: an alkaline earth element, a rare earth element and a combination thereof; and wherein B comprises a transition metal element wherein $\delta$ is a positive quantity less than the integer it follows.

9. The method according to claim 8 wherein the $ABO_{3-\delta}$ perovskites is selected from the group consisting of: $LaTiO_{3-\delta}$, $SrTiO_{3-\delta}$, $(La,Sr)TiO_{3-\delta}$, $YTiO_{3-\delta}$, $CaTiO_{3-\delta}$, $(Y,Ca)TiO_{3-\delta}$, $LaMnO_{3-\delta}$, $SrMnO_{3-\delta}$, $(La,Sr)MnO_{3-\delta}$, $CaMnO_{3-\delta}$, $PrMnO_{3-\delta}$ and $(Ca,Pr)MnO_{3-\delta}$ wherein $\delta$ is a positive quantity less than the integer it follows.

10. The method of claim 1, wherein the base comprises a transition metal oxide and a p-doped region disposed on top of a portion thereof.

11. A method of programming a programmable element having a source electrode, a drain electrode, and a base, wherein the base is the sole component of the programmable element contacted by a reference voltage contact, wherein the method comprises the steps of:
   applying positive voltage pulses to both the source electrode and to the drain electrode to obtain a first programming state wherein the first programming state is nonvolatile;
   applying negative voltage pulses to both the source electrode and to the drain electrode to obtain a second programming state wherein the second programming state is nonvolatile;
   applying a positive voltage pulse to the source electrode and a negative voltage pulse to the drain electrode to obtain a third programming state wherein the third programming state is nonvolatile; and
   applying a negative voltage pulse to the source electrode and a positive voltage pulse to the drain electrode to obtain a fourth programming state wherein the fourth programming state is nonvolatile.

* * * * *